(12) United States Patent
Chang et al.

(10) Patent No.: US 7,639,023 B2
(45) Date of Patent: Dec. 29, 2009

(54) FUEL CELL VOLTAGE MEASUREMENT DEVICE

(75) Inventors: Hsu-Lin Chang, Hsinchu (TW); Jar-Lu Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 706 days.

(21) Appl. No.: 11/475,944

(22) Filed: Jun. 28, 2006

(65) Prior Publication Data

US 2007/0108960 A1 May 17, 2007

(30) Foreign Application Priority Data

Nov. 14, 2005 (TW) .............................. 94139918 A

(51) Int. Cl.
*G01R 27/08* (2006.01)
*G01R 31/02* (2006.01)
*H01M 8/00* (2006.01)
*H01M 10/48* (2006.01)

(52) U.S. Cl. .................. 324/713; 324/72.5; 429/12; 429/90

(58) Field of Classification Search ................. 324/713, 324/72, 72.5; 429/12, 90–93
See application file for complete search history.

(56) References Cited

U.S. PATENT DOCUMENTS

| 6,798,221 | B2 * | 9/2004 | Wang et al. | ................. 324/713 |
| 7,329,469 | B2 * | 2/2008 | Hortop | ........................ 429/12 |
| 2004/0227518 | A1 | 11/2004 | Joos et al. | |
| 2004/0257031 | A1 * | 12/2004 | Kang | ........................ 320/101 |

\* cited by examiner

*Primary Examiner*—Timothy J Dole
(74) *Attorney, Agent, or Firm*—Birch, Stewart, Kolasch & Birch, LLP

(57) ABSTRACT

A fuel cell voltage measurement device includes a main beam provided at two sides with a transverse slot each for slidably receiving a plurality of slides therein, and a plurality of retractable probe assemblies separately mounted on the slides to move along with the slides. Therefore, the retractable probe assemblies are applicable to contact with fuel cell bipolar plates having different heights and/or thicknesses, making the voltage measurement device highly practical for use. A voltage signal collecting unit is provided on a top of the main beam for directly collecting the measured voltage signals to obtain a voltage state of the fuel cell.

11 Claims, 6 Drawing Sheets

FUEL CELL VOLTAGE MEASUREMENT DEVICE

FIELD OF THE INVENTION

The present invention relates to a fuel cell voltage measurement device, and more particularly to a voltage measurement device adapted to measure the voltage of differently designed and sized fuel cells.

BACKGROUND OF THE INVENTION

A proton exchange membrane fuel cell (PEMFC) is also referred to as a high molecular membrane fuel cell, a basic structure of which is a monocell consisting of a membrane electrode assembly (MEA) disposed among two pieces of bipolar plates, a current collector, and two end plates. Two opposite sides divided by the PEMFC membrane electrode assembly are an anode having hydrogen or a rearrangement gas, and a cathode having oxygen or air. At the anode, there is an oxidation reaction, and the cathode a reduction reaction. When the hydrogen at the anode side contacts with a catalyst, which is usually platinum or a platinum alloy, adjoining to the proton exchange membrane, the hydrogen molecule decomposes into hydrogen ion and electron. The electron would move toward the cathode side via a bridge interconnecting the anode and the cathode and a load serially connected to the bridge. On the other hand, the hydrogen ion directly passes through the proton exchange membrane to reach the cathode from the anode. It is noted the proton exchange membrane is a moisture-laden membrane and has the property of allowing only the hydrogen ion together with water molecule to pass therethrough while other gas molecules are blocked. Under an action of the catalyst at the cathode side, the electron reaches the cathode via the bridge bonds with the oxygen to produce oxygen ion, which then bonds with the hydrogen ion passed through the proton exchange membrane to form water molecule. This is the so-called electrochemical oxidation and reduction reaction process.

The monocell of PEMFC generally has an operating voltage from 0.6V to 0.9V, which is too small to actuate most electric apparatus. Therefore, in practical application, it is necessary to serially connect a plurality of monocells to form a fuel cell bank to increase the cell voltage. Each fuel cell bank includes at least two monocells. The number of serially connected monocells depends on actual voltage requirement. The fuel cell bank has a total voltage equal to a sum of voltages of all monocells. According to general electricity principle, the serially connected monocells in the fuel cell bank have the same current flown therethrough, but not necessarily have the same voltage. Under an ideal condition, the monocells in a fuel cell bank should have the same voltage. However, from the viewpoints of thermodynamics and kinetics, due to the temperature distribution in different zones and the flowing of reactant gas, it is unable to ensure that all the monocells could operate under identical conditions. As a result, the monocells have different voltages from one another. Moreover, errors produced in the process of assembling the fuel cell bank would possibly cause gas leakage in some of the monocells or the phenomenon of crossover of gas, which would also result in voltage difference among monocells. Therefore, it is possible to know whether there is any problem in the process of assembling the fuel cell bank from the voltage values of monocells included in the fuel cell bank. That is, the voltage values of monocells may be used as a basis for diagnosing a fuel cell bank. Meanwhile, the failure of any one of the monocells in the fuel cell bank is deemed as an open circuit possibly causing the failure of the whole fuel cell bank. Therefore, the voltage measurement for monocell is very important to the performance of the fuel cell bank.

U.S. Pat. No. 6,724,194 & 6,410,176; WO 2004/051773; CA 2277397 & 2454782; DE 10334556; and JP 2003086205, 2004079192 & 2004087163 disclose several means of measuring the voltage of a fuel cell. Most of these prior art structures have fixed or specific applications and are not readily applicable to general fuel cell voltage measurement.

SUMMARY OF THE INVENTION

A primary object of the present invention is to provide a fuel cell voltage measurement device adapted to quickly measure the voltages at a plurality of unequally spaced and/or non-coplanar points on a fuel cell.

Another object of the present invention is to provide a fuel cell voltage measurement device that is an independent device to facilitate quick measurement of voltages of monocells in a fuel cell bank.

To achieve the above and other objects, the fuel cell voltage measurement device according to a preferred embodiment of the present invention includes a main beam, a plurality of slides, a plurality of retractable probe assemblies, and a voltage signal collecting unit. The main beam is provided at two sides with a transverse slot each for slidably receiving the slides therein. The retractable probe assemblies are separately mounted on the slides to move along with the slides in the transverse slots, so as to match with fuel cells having different thicknesses. Each of the retractable probe assemblies provides an axial elasticity, which not only ensures a firm contact of the retractable probe assembly with the fuel cell, but also allows the retractable probe assembly to apply to fuel cells of different heights. The voltage signal collecting unit is electrically connected to the retractable probe assemblies for collecting voltage signals measured by the retractable probe assemblies to obtain a voltage state of the fuel cell.

The retractable probe assembly is mounted on the slide via a probe holder, which is connected to the slide by way of bonding, welding, screwing, or tight fitting. A slide fixing plate is provided below the main beam to clamp the slides.

The voltage signal collecting unit further includes a connector for connecting to a voltage signal collector, so as to indicate the measured fuel cell voltage.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
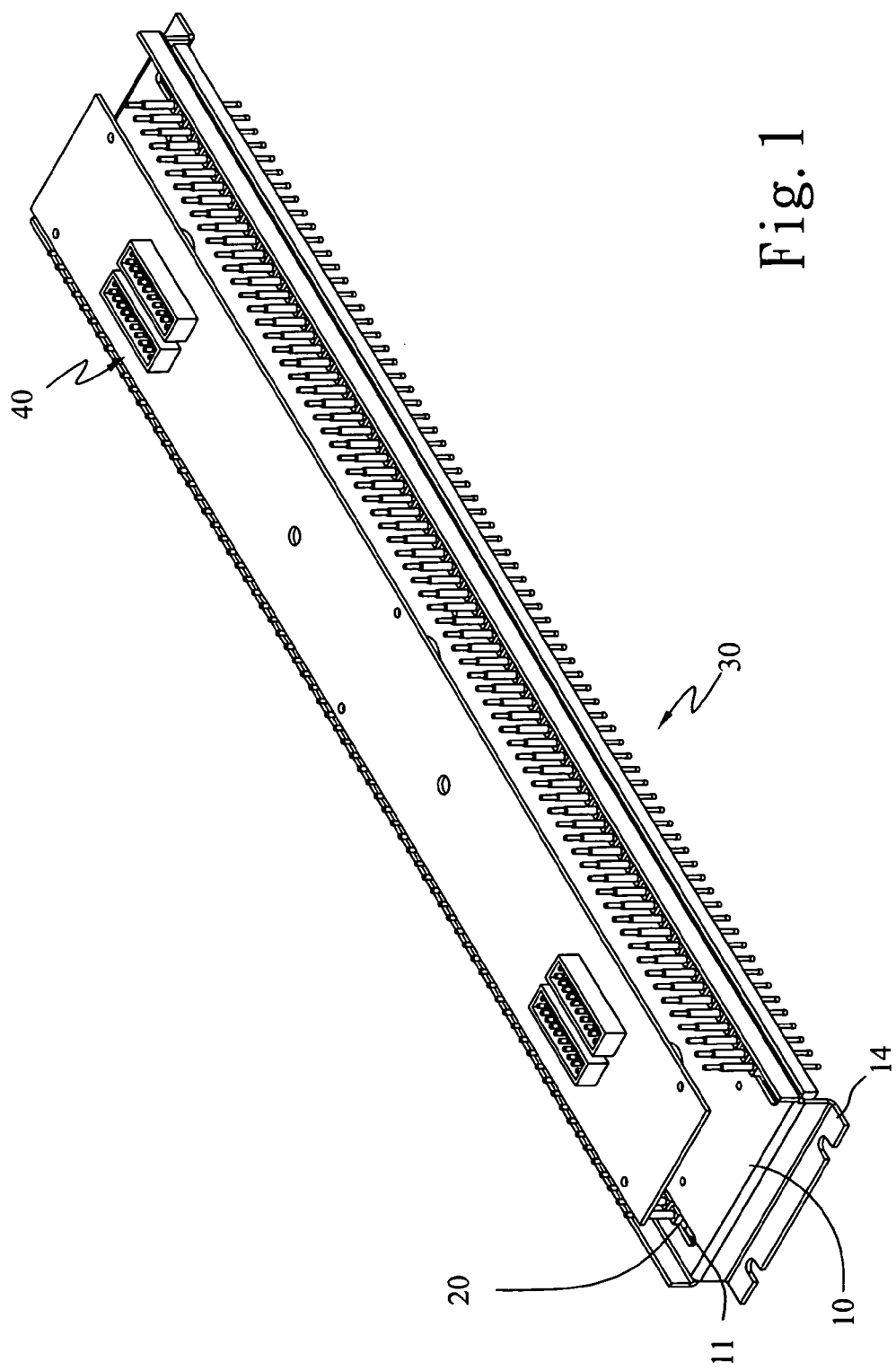
FIG. 1 is a perspective view of a fuel cell voltage measurement device according to the present invention.

Please refer to FIG. 1 in which a fuel cell voltage measurement device according to a preferred embodiment of the present invention is shown. As shown, the voltage measurement device includes a main beam 10, a plurality of slides 20, a plurality of retractable probe assemblies 30 in a number corresponding to the slides 20, and a voltage signal collecting unit 40. The main beam 10 is substantially a flat plate having a transverse slot 11 extended across each side thereof and an outward bent side board formed at each end thereof. The slides 20 are received in the slots 11, so as to slidably move along the slots 11 with one-dimensional free mobility. The retractable probe assemblies 30 are correspondingly mounted on the slides 20 to slide along with the slides 20. The voltage signal collecting unit 40 is mounted on a top of the main beam 10 to collect voltage signals collected by the retractable probe assemblies 30.

Figure 2:
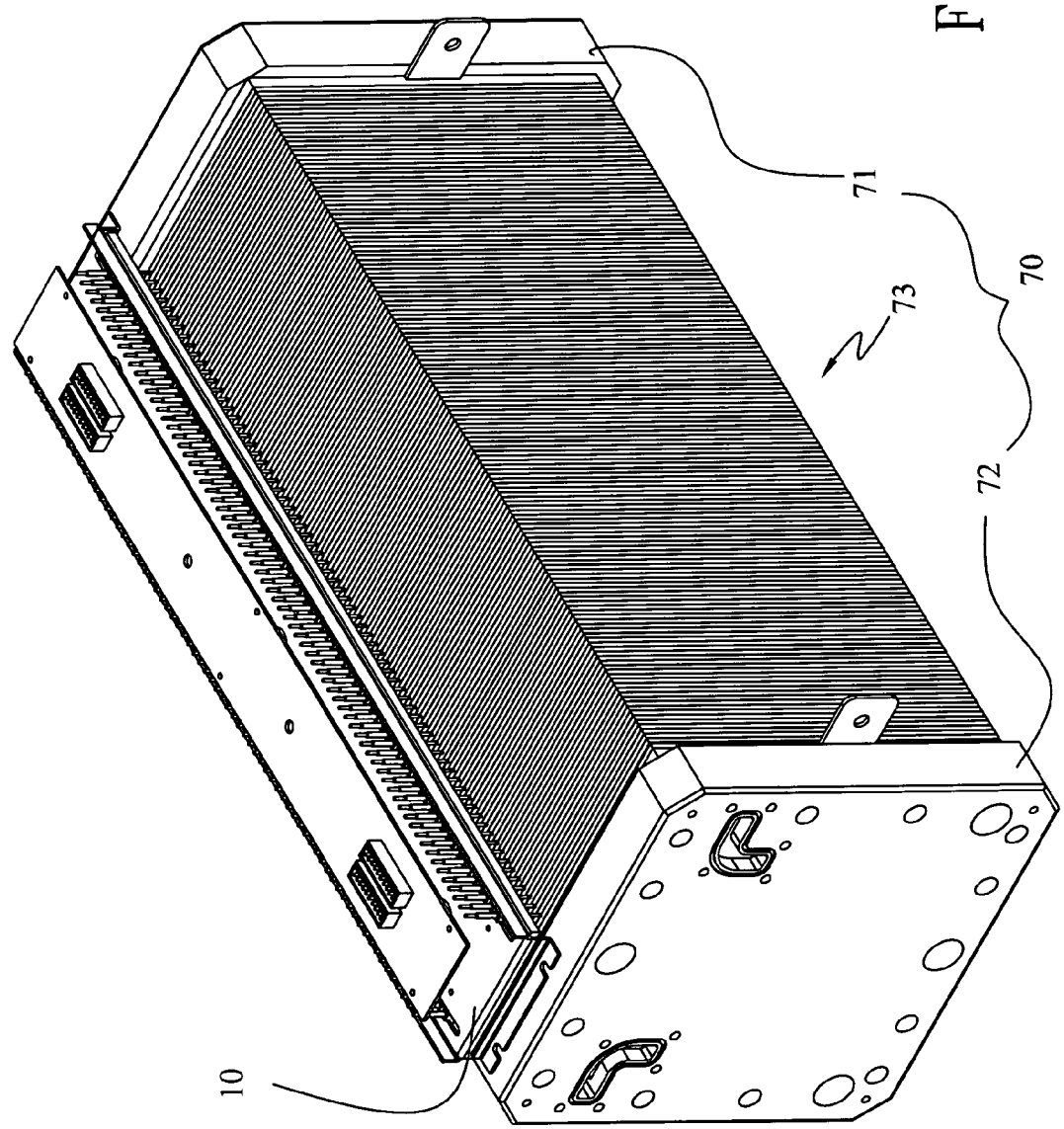
FIG. 2 shows the association of the voltage measurement device of the present invention with a fuel cell.

Please refer to FIG. 2. The voltage measurement device of the present invention may straddle a fuel cell 70 with the side boards 14 at two ends of the main beam 10 seated on two end plates 71, 72 of the fuel cell 70, allowing the retractable probe assemblies 30 to measure voltage signals of the fuel cell 70. Please refer to FIGS. 3A and 3B. The slide 20 is received in the slot 11 with a bottom clamped by a slide fixing plate 12. A slide fixing cap 51 cooperates with a spring 52 and a slide fixing post 53 to hold the slide fixing plate 12 in place. More specifically, the slide fixing post 53 downward extends through the main beam 10 to hold the slide fixing plate 12 in place, and the slide fixing cap 51 and the spring 52 together ensure the slide fixing post 53 is in the position of holding the slide fixing plate 12 in place. These arrangements are provided to clamp and fix the slide 20 in the slot 11 of the main beam 10, so that the slide 20 is limited to slide only in the slot 11 without the risk of separating from the main beam 10. Of course, other fixing manners using screws or rivets may also be used to replace these arrangements.

Figure 4:
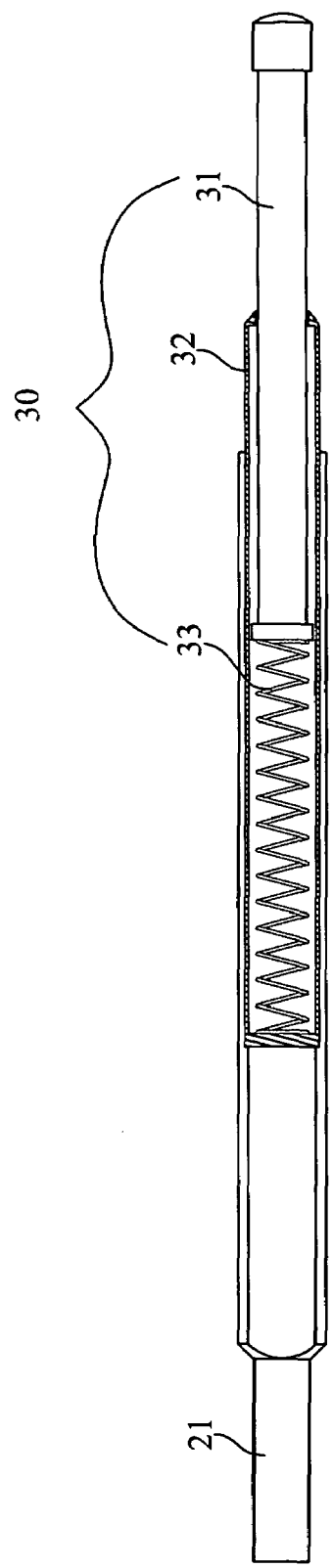
FIG. 4 is an enlarged sectional view of a retractable probe assembly for the voltage measurement device of the present invention.

The retractable probe assembly 30 is associated with the slide 20 via a probe holder 21. The probe holder 21 may be connected to the slide 20 in different manners, such as bonding, welding, screwing, tight fitting, etc. As shown in FIG. 4, the retractable probe assembly 30 includes a probe pin 31, a spring sleeve 32, and a spring 33 disposed in the spring sleeve 32. The probe pin 31 is partially received in a lower part of the spring sleeve 32 to be normally pushed forward by the spring 33. When the probe pin 31 retracts, the spring 33 is compressed to provide an axial restoring force to the probe pin 31. The spring sleeve 32 restricts the probe pin 31 to move only in an axial direction of the spring sleeve 32. For the purpose of measuring voltage, the probe pin 31 is preferably made of a copper material.

Figure 3A:
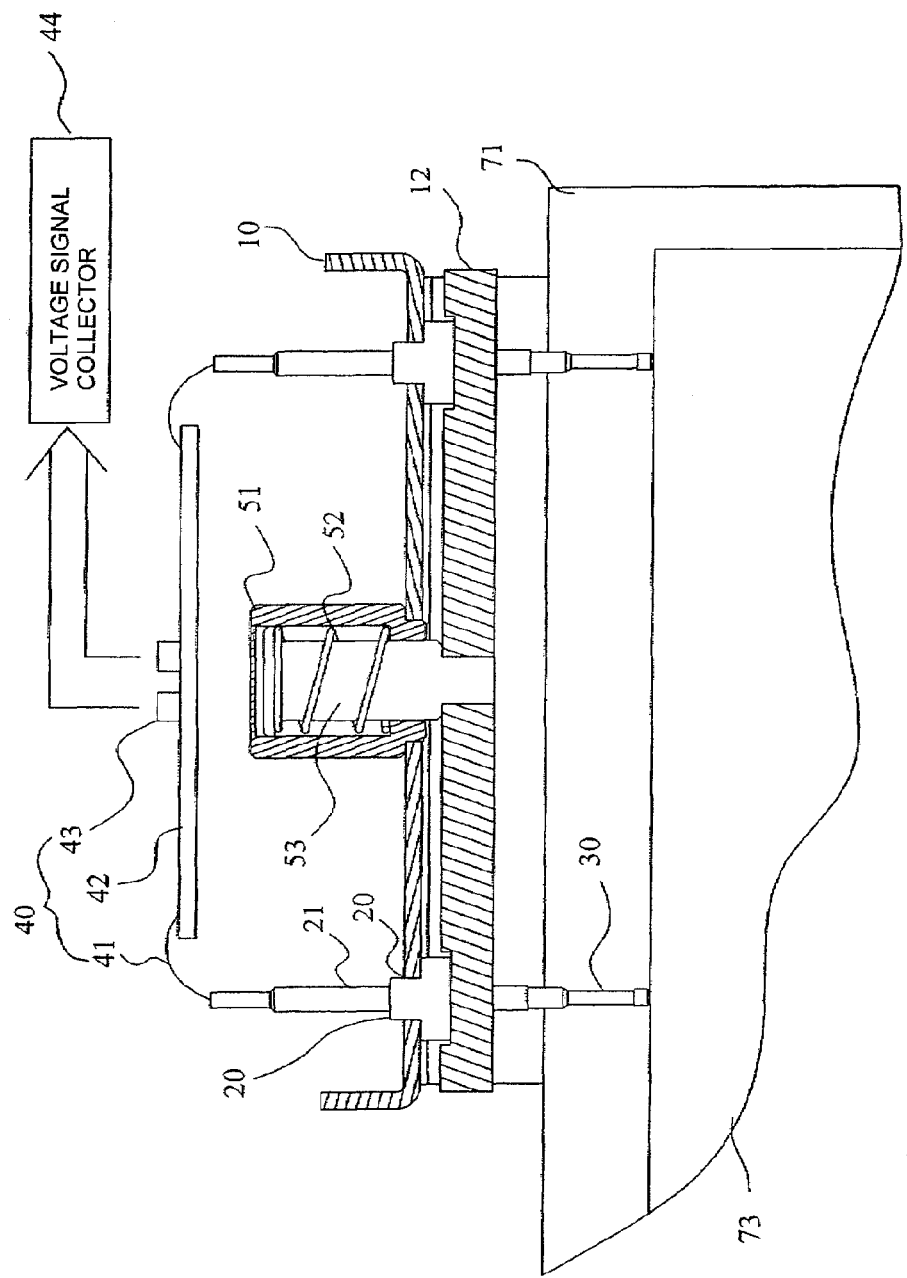
FIG. 3A is an enlarged fragmental cross sectional view of FIG. 2.
Figure 3B:
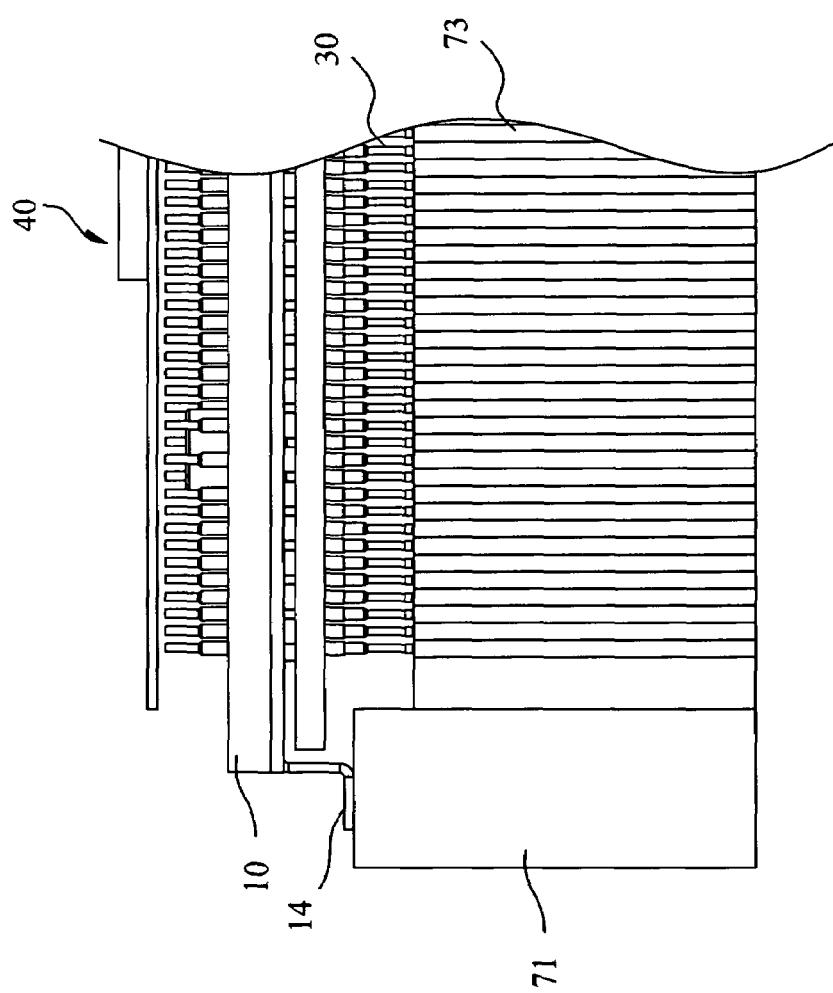
FIG. 3B is an enlarged fragmentary vertical sectional view of FIG. 2.

As shown in FIGS. 3A and 3B, voltage signals received by the retractable probe assemblies 30 are collected by the voltage signal collecting unit 40. The voltage signal collecting unit 40 includes a circuit board 42, a plurality of voltage signal measuring wires 41, and a connector 43. The voltage signal measuring wire 41 may be in the form of a lead wire or a soft circuit board to connect the circuit board 42 to the retractable probe assembly 30, so as to send the voltage signals received by the retractable probe assembly 30 to the connector 43 on the circuit board 42. The connector 43 is further connected to a voltage signal collector 44, at where all voltage signals are gathered to obtain a voltage state of the fuel cell 70. It is noted the voltage signal collector 44 may be an externally connected or a built-in member.

Figure 6:
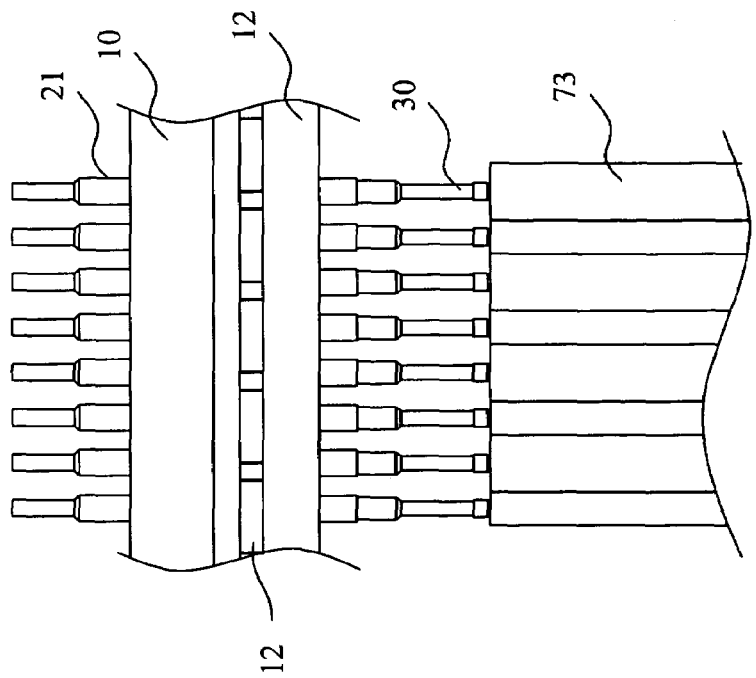
FIG. 6 is an enlarged fragmentary front view showing the use of the voltage measurement device of the present invention on a fuel cell having bipolar plates in different thicknesses.
Figure 5:
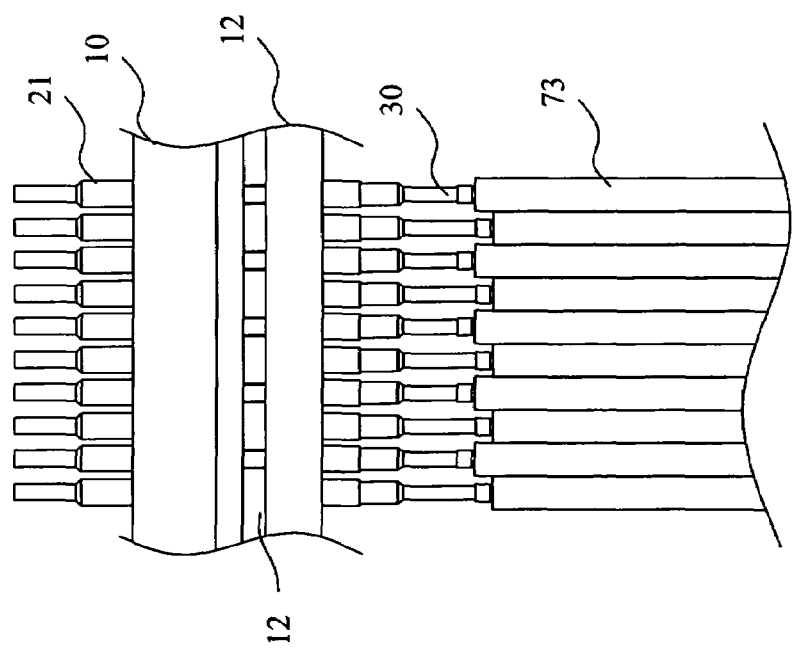
FIG. 5 is an enlarged fragmentary front view showing the use of the voltage measurement device of the present invention on a fuel cell having bipolar plates in different heights.

To measure voltage, as shown in FIGS. 3A and 3B, the retractable probe assemblies 30 are caused to contact with a plurality of bipolar plates 73 of the fuel cell 70 in one-to-one correspondence. Since the probe pins 31 are axially elastically retractable, the retractable probe assemblies 30 may be applied to bipolar plates 73 having different heights, as shown in FIG. 5. Meanwhile, in the case of bipolar plates 73 having different thicknesses, as shown in FIG. 6, since the slides 20 are freely slidable along the transverse slots 11 of the main beam 10, the retractable probe assemblies 30 may still be adjusted to different positions according to the thickness of the bipolar plates 73.

With the above arrangements, it is not necessary to measure the monocells of the fuel cell 70 one by one. Therefore, labor and time required to measure the voltage of the fuel cell 70 is largely reduced. Meanwhile, with the retractable probe assemblies 30 and the slides 20, the voltage measurement device of the present invention is applicable to fuel cells having different thicknesses and heights.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A fuel cell voltage measurement device, comprising:
   a main beam having a transverse slot provided at each side thereof;
   a plurality of slides being slidably received in said transverse slots of said main beam;
   a plurality of retractable probe assemblies being separately mounted on said slides for contacting with a fuel cell; and
   a voltage signal collecting unit mounted on a top of said main beam to electrically connect to said retractable probe assemblies for collecting voltage signals of said fuel cell measured by said retractable probe assemblies.

2. The fuel cell voltage measurement device as claimed in claim 1, further comprising a plurality of probe holders separately connected to said slides, and wherein said retractable probe assemblies are mounted on said slides via said probe holders.

3. The fuel cell voltage measurement device as claimed in claim 2, wherein said probe holders are fixed to said slides in a manner selected from the group consisting of bonding, welding, screwing, and tight fitting.

4. The fuel cell voltage measurement device as claimed in claim 1, further comprising a slide fixing plate mounted below said main beam for clamping said slides in place without separating from said transverse slots.

5. The fuel cell voltage measurement device as claimed in claim 1, wherein said voltage signal collecting unit includes a circuit board mounted above said main beam, and a plurality of voltage signal measuring wires connected to said retractable probe assemblies, so as to collect voltage signals of said fuel cell measured by said retractable probe assemblies.

6. The fuel cell voltage measurement device as claimed in claim 5, wherein said voltage signal collecting unit further includes a connector mounted on said circuit board for outputting said voltage signals.

7. The fuel cell voltage measurement device as claimed in claim 6, wherein said voltage signal collecting unit further includes a voltage signal collector connected to said connector for collecting said voltage signals.

8. The fuel cell voltage measurement device as claimed in claim 5, wherein each of said voltage signal measuring wires is a lead wire.

9. The fuel cell voltage measurement device as claimed in claim 5, wherein each of said voltage signal measuring wires is a soft circuit board.

10. The fuel cell voltage measurement device as claimed in claim 1, wherein said main beam straddles said fuel cell with two ends seated on two end plates of said fuel cell.

11. The fuel cell voltage measurement device as claimed in claim 1, wherein each of said retractable probe assemblies includes a spring sleeve, a spring mounted in said spring sleeve, and a probe pin partially received in said spring sleeve to be normally pushed by said spring to project from a front end of said spring sleeve for bearing against said fuel cell.

* * * * *